United States Patent [19]
Mori

[11] Patent Number: 5,296,892
[45] Date of Patent: Mar. 22, 1994

[54] ILLUMINATING APPARATUS AND PROJECTION EXPOSURE APPARATUS PROVIDED WITH SUCH AN ILLUMINATING APPARATUS

[75] Inventor: Takashi Mori, Kawasaki, Japan

[73] Assignee: Nikon Corporation, Tokyo, Japan

[21] Appl. No.: 8,370

[22] Filed: Jan. 22, 1993

[30] Foreign Application Priority Data

Feb. 1, 1992 [JP] Japan .................................. 4-46140

[51] Int. Cl.$^5$ ...................... G03B 27/42; G03B 27/54
[52] U.S. Cl. ........................................ 355/67; 355/53
[58] Field of Search ...................... 355/53, 67

[56] References Cited

U.S. PATENT DOCUMENTS

| | | | |
|---|---|---|---|
| 4,851,882 | 7/1989 | Takahashi et al. | 355/67 X |
| 4,851,978 | 7/1989 | Ichihara | 355/67 X |
| 4,937,619 | 6/1990 | Fukuda et al. | 355/53 |
| 4,939,630 | 7/1990 | Kikuchi et al. | 355/67 X |
| 4,970,546 | 11/1990 | Suzuki et al. | 355/53 |
| 4,988,188 | 1/1991 | Ohta | 355/67 |
| 5,097,291 | 3/1992 | Suzuki | 355/53 X |
| 5,117,254 | 5/1992 | Kawashima et al. | 355/53 X |
| 5,144,362 | 9/1992 | Kamon et al. | 355/53 |
| 5,160,962 | 11/1992 | Miura et al. | 355/53 |
| 5,191,374 | 3/1993 | Hazama et al. | 355/53 X |
| 5,194,893 | 3/1993 | Nishi | 355/53 |
| 5,237,367 | 8/1993 | Kudo | 355/67 |
| 5,245,384 | 9/1993 | Mori | 355/67 |

FOREIGN PATENT DOCUMENTS

| | | |
|---|---|---|
| 6250811 | 4/1982 | Japan . |
| 59-155843 | 9/1984 | Japan . |
| 1-96929 | 4/1989 | Japan . |

*Primary Examiner*—Richard A. Wintercorn
*Attorney, Agent, or Firm*—Shapiro and Shapiro

[57] ABSTRACT

An illuminating apparatus comprises a first optical integrator and a second optical integrator which are replaceably arranged. The second optical integrator is structured to provide substantially the same number of secondary light sources as the first optical integrator but with the different size of surface light source formed by these second light sources. Further, the structure is arranged so that it has an aperture number on the emission side, which is equal to the aperture number of the first optical integrator on its emission side. Hence, the illuminance evenness is not degraded even when the $\sigma$ value is significantly varied.

24 Claims, 5 Drawing Sheets

ILLUMINATING APPARATUS AND PROJECTION EXPOSURE APPARATUS PROVIDED WITH SUCH AN ILLUMINATING APPARATUS

BACKGROUND OF THE INVENTION

1. Field of the Invention

The present invention relates to an illuminating apparatus preferably applicable to a projection exposure apparatus used for the fabrication of semiconductor devices, for example.

2. Related Background Art

In fabricating semiconductor devices having ultrafine patterns such as LSI and VLSI by photolithography, there has been used a reducing projection type projection exposure apparatus. For a projection exposure apparatus of the kind, an enormous amount of endeavor has continuously been exercised in achieving an accurate transfer of finer patterns. To this end, it has been attempted that the wavelength of the exposure light is shortened, and that the aperture number (hereinafter referred to as N.A.) of the projection optical system is increased. A projection optical system has been implemented even with an N.A. of 0.5 or more. In an actual stepping using a projection optical system having such a large N.A. as this, it becomes important to optimize the N.A. of the projection optical system and the illuminating conditions of the illuminating optical system in accordance with the minimum width between lines and the like of an objective pattern.

The illuminating conditions of the illuminating optical system are determined by the so-called $\sigma$ value which represents the coherency degree of the illuminating light. Generally, given an N.A. on the incident side of a projection optical system as NA1, and the N.A. on the emission side of an illuminating optical system as NA2, the $\sigma$ value can be represented as NA2/NA1. When the $\sigma$ value is zero, it will be a coherent illumination. Also, in other words, given the diameter of the pupil of a projection optical system as $\phi 1$ and the diameter of a light source image of the illuminating optical system to be formed on the pupil of the projection optical system as $\phi 2$, the $\sigma$ value will be $\phi 2/\phi 1$. In this respect, there has been proposed a technique to adjust the $\sigma$ value by adjusting the ratio between the N.A. of both optical systems in order to appropriately balance the resolution and contrast for a given pattern in Japanese Patent Laid-open Application No. 59-155843 and others, for example.

Here, in recent years, the so-called phase shift method wherein a further enhancement of resolution is attempted by giving an appropriate phase difference to the interrelated reticle patterns has been proposed (in Japanese Patent Publication No. 62-50811, for example). Endeavors are being made to put this method into practice. In a case of this phase shift method, its illuminating conditions are essentially important. Whereas the $\sigma$ value is 0.5–0.7 in a conventional system, it is required for this method to employ a high illuminating light having a spatial coherency with a $\sigma$ value of approximately 0.2–0.3. As a result, there is an increasing demand on the expansion of variable range of illuminating conditions so as to comply with the requirements for various reticles.

Figure 6:
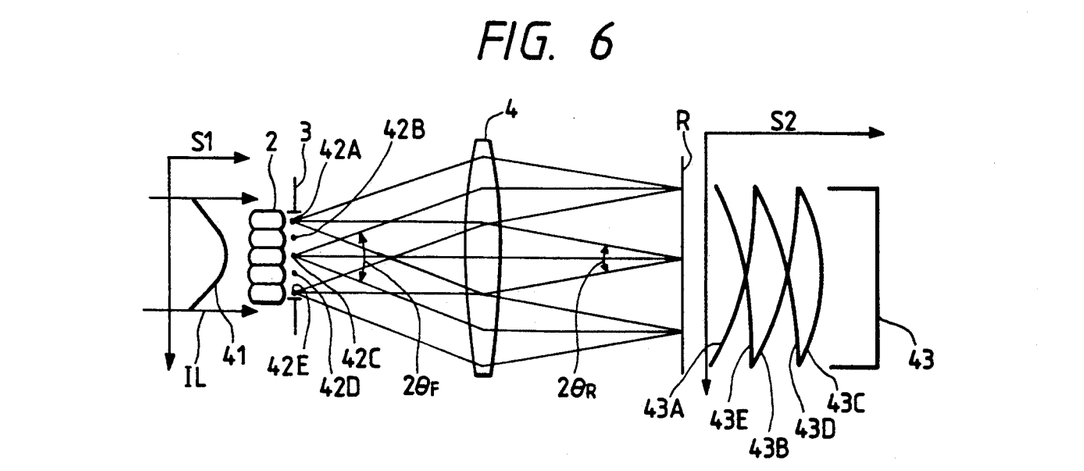
FIG. 6 is a view illustrating the integrating function of the optical integrator in a conventional illuminating apparatus.

FIG. 6 is a cross-sectional view showing the principal part of an illuminating optical system of a conventional projection exposure apparatus. As shown in FIG. 6, an illuminating light IL composed of parallel beams emitted from a light source system which is not shown is separated by each of the lens elements of an optical integrator 2 comprising a flyeye lens. On the emitting planes of the elements, secondary light source images (hereinafter referred to simply as secondary light source) 42A to 42E are formed. In practice, the secondary light sources are two dimensionally distributed in the plane perpendicular to the surface of FIG. 6. Here, surface light sources are formed substantially. The total outer diameter of these secondary light sources (surface light sources) is regulated by a variable aperture stop 3. The light beams from the secondary light sources 42A to 42E are superimposed by a condenser lens 4 to be overlapped, respectively, to evenly illuminate the reticle R which serves as the surface of an object to be irradiated. Further, the illuminating light transmitted through the reticle R enables third light source images to be formed on the pupil of a projection optical system which is not shown. Thus, the so-called Köhler illumination is implemented.

In FIG. 6, if it is assumed that the illuminance S1 of the illuminating light IL on the incident plane of the optical integrator 2 is distributed as a distribution 41, the illuminance distribution of the illuminating light IL on the reticle R cannot be even just by illuminating the reticle R with an increased diameter of the illuminating light IL. Therefore, the secondary light sources 42A to 42E are formed by the optical integrator 2, and if the reticle R is irradiated by the each of the light sources 42A to 42E through the condenser lens 4, the illuminance distribution on the reticle R becomes the illuminance distribution which is obtainable by integrating the illuminating rays of light 43A to 43E. Consequently, with the integral effect thus obtainable, the evenness of the illuminance distribution on the reticle R becomes extremely desirable as represented by the distribution at 43.

In this case, given the focal length of the condenser lens 4 as fc, the aperture diameter of the variable aperture stop 3 as D, and the aperture angle of the illuminating light IL of the reticle R as $2\theta_R$, an $NA_{IL}$ of N.A. of the illuminating optical system will be as follows provided that the condenser lens 4 satisfies sinusoid conditions:

$$NA_{IL} = \sin\theta_R = D/(2fc)$$

Also, when the optical integrator 2 satisfies the sinusoid conditions, the $NA_{OI}$ of the N.A. of the optical integrator should be as follows in order to obtain an even illuminance on the reticle R if the aperture angle of the emission side of each of the lens elements constituting the system is given as $2\theta_F$ and the size of an area to be irradiated on the reticle R as 2y:

$$NA_{OI} = \sin\theta_F = y/(fc)$$

Then, by changing the $NA_{IL}$s, the $\sigma$ value of the illuminating optical system can be changed. Hence, in the prior art, the $\sigma$ value is changed by varying the aperture diameter D of the variable aperture stop 3 arranged for the secondary light source plane. Also, the $\sigma$ value is proportional to the aperture diameter D of the variable aperture stop 3 and the aperture diameter D is proportional to the number of the lens elements constituting the optical integrator 2 in the direction parallel to the plane of FIG. 6. Here, in the example shown in FIG. 6, the secondary light sources are distributed in the direction perpendicular to the plane of FIG. 6 besides the secondary light sources 42A to 42E. Therefore, it may be possible to define that the square of its $\sigma$ value is proportional to the number of the secondary light sources integrated by the condenser lens 4.

Generally, in an aligner of the kind, the rigid dimensional precision is required for patterns in the exposure area. Thus, its illuminating optical system must be capable of providing a highly even illuminance over the area to be irradiated. Such a high evenness of the illuminance is mainly implemented by overlapping the separated light beams by the optical integrator 2 to be superposed by the use of the condenser lens 4 on the area to be irradiated. The number of the light beams thus separated must be sufficient in accordance with the precision of evenness desired. Nevertheless, assuming that a $\sigma$ value is to be changed to a smaller side, the number of light beams from the secondary light sources to be integrated on the reticle R is abruptly reduced as shown in FIG. 6 if the aperture diameter of the variable aperture stop 3 arranged on the secondary light source plane is made smaller as described above. There is thus a possibility that a desired evenness of the illuminance cannot be maintained.

As described above, the number of the elements of the optical integrator 2 which contribute to the light beam separation is almost proportional to the $\sigma$ value. Therefore, if, on the contrary, a sufficient number of elements should be secured in order to maintain the desired evenness of illuminance in a case of a $\sigma$ value being small, the required number of elements will become enormous at a maximum $\sigma$ value; thus making it extremely difficult to fabricate the system.

SUMMARY OF THE INVENTION

With a view to solving the above-mentioned problems, the present invention is designed. It is an object of the invention to provide an illuminating apparatus capable of preventing its illuminance evenness from being degraded even when the $\sigma$ value is to be changed significantly.

In order to achieve this object, an illuminating apparatus according to an embodiment of the present invention includes the following:

light source means to supply parallel light beams;

multiple light beam formation means to form a plurality of secondary light sources with the parallel light beams from the foregoing light source means; and a condensing optical system to superpose light beams to illuminate an area to be irradiated by condensing the light beams form the foregoing plural secondary light sources.

The multiple light beam formation means includes a first optical integrator forming a given number of the secondary light sources and a second optical integrator replaceable with the first optical integrator and capable of forming substantially the same number of secondary light sources as the first optical integrator; and this means is arranged in such a manner that when the first optical integrator is provided in the illuminating light path, the area to be irradiated is illuminated with a first aperture number, and when the second optical integrator is provided in the light path, the area to be irradiated is illuminated with a second aperture number which differs from the first aperture number.

Thus, in an illuminating apparatus according to an embodiment of the present invention, even when the first optical integrator is replaced with the second optical integrator (that is, provided in the illuminating light path of the illuminating apparatus), the plural numbers of the secondary light sources which are superposed on the area to be irradiated are not changed. The structure is arranged to make the aperture number on the side of the area to be irradiated variable for the illuminating apparatus. In this way, even if the aperture number is varied to change the $\sigma$ value of the illuminating apparatus significantly, its illuminance evenness will not be degraded.

Hereinafter, this principle will be described.

Figure 3:
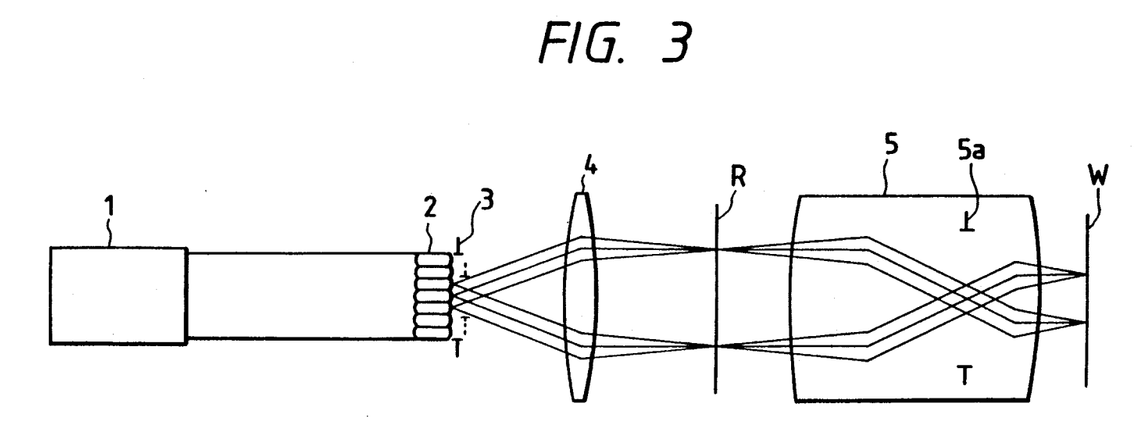
FIG. 3 is a view schematically showing the structure of a projection exposure apparatus provided with a conventional illuminating apparatus.

FIG. 3 illustrates schematically the lens structures and optical passages of an illuminating apparatus, which are the prerequisite of the present invention. In FIG. 3, parallel light beams from a light source means 1 enter a flyeye lens 2 serving as multiple light beam formation means to allow a number of secondary light sources to be formed on the emission side, at the same time a fixed or variable aperture stop 3 being provided for the secondary light source plane. Then, a number of light beams from the secondary light sources are superposed to illuminate the area to be irradiated on the reticle R (a first object) by a condensing optical system 4. Hence, the even illumination can be attained. With this illumination, a given pattern on the reticle R is transferred to a wafer W (a second object) by a projection optical system. Also, according to the example shown in FIG. 3, the condensing optical system 4 forms a third light source image on the pupil 5a of the projection optical system 5 simultaneously. In other words, with the example shown in FIG. 3, it is possible to attain the Köhler illumination.

Now, in the prior art, the $\sigma$ value is changed by the use of the aperture stop 3, that is, in the illuminating apparatus shown in FIG. 3, the aperture diameter of the aperture stop 3 arranged in the position where the secondary light sources are formed is stopped down as indicated by dotted lines in order to attain the variation of the foregoing $\sigma$ value.

However, due to the light shielding by the aperture stop 3, the number of the secondary light sources which contribute to the superposition of the light beams is reduced to degrade the illuminance evenness. On the contrary to this, according to the present invention, it is attempted to maintain the illuminance evenness at the time of varying the $\sigma$ value by preventing the number of the secondary light sources from being reduced as far as possible.

Figure 4A:
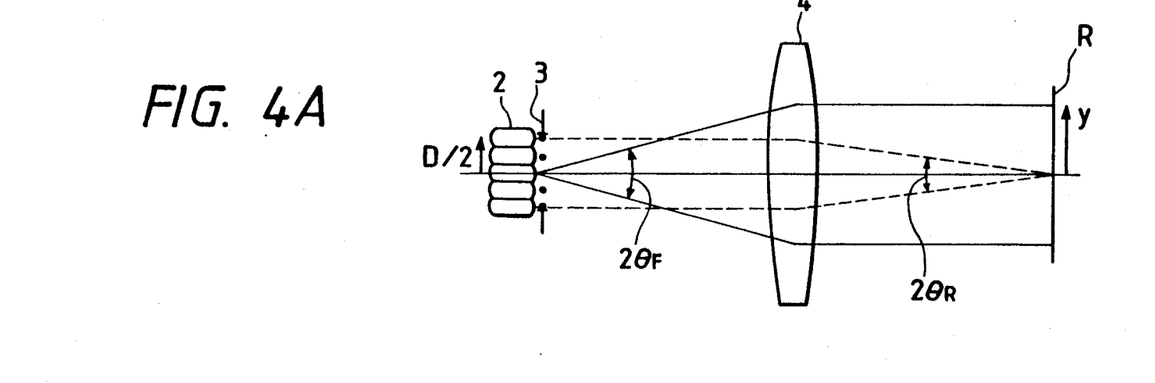
FIG. 4A is a view illustrating the relationship between the optical integrator and condensing optical system.
Figure 4B:
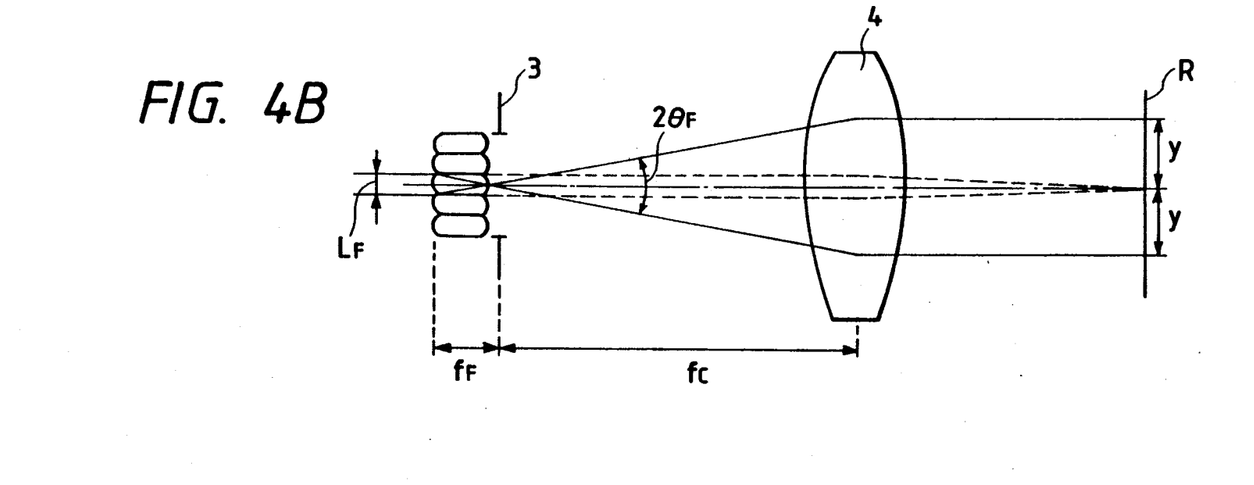
FIG. 4B is a view illustrating the relationship between the size of the lens elements in the optical integrator and the size of the area to be illuminated.

Now, with reference to FIG. 4A and FIG. 4B, the principle of the present invention will be described. FIG. 4A and FIG. 4B illustrate the case where the area R to be irradiated is illuminated vertically (telecentrically). The same is also applicable to the case where it is not telecentric. In FIG. 4A, given the aperture diameter of the aperture stop 3 as D, the N.A. on the emission side where the multiple light beam formation means 2 is composed of a plurality of lens elements (flyeye lens) as $\sin\theta_F$, the focal length of the condensing optical system 4 as fc, the height of the area to be irradiated as y, and the N.A. of the illuminating optical system which determines the $\sigma$ value as $\sin\theta_R$ the following equation are formed provided that the multiple light beam formation means 2 and the condensing optical system 4 satisfy the sinusoid conditions:

$$fc \cdot \sin\theta_F = Y \quad (1)$$

$$fc \cdot \sin\theta_R = D/2 \quad (2)$$

From the equation (2), it is clear that the variation of the N.A. ($\sin\theta_R$) of the illuminating system can be attained by changing the D or Fc. The object of the present invention is not to change as far as possible at this juncture the number of the secondary light sources which contribute to the superposition of the light beams.

Figure 1A:
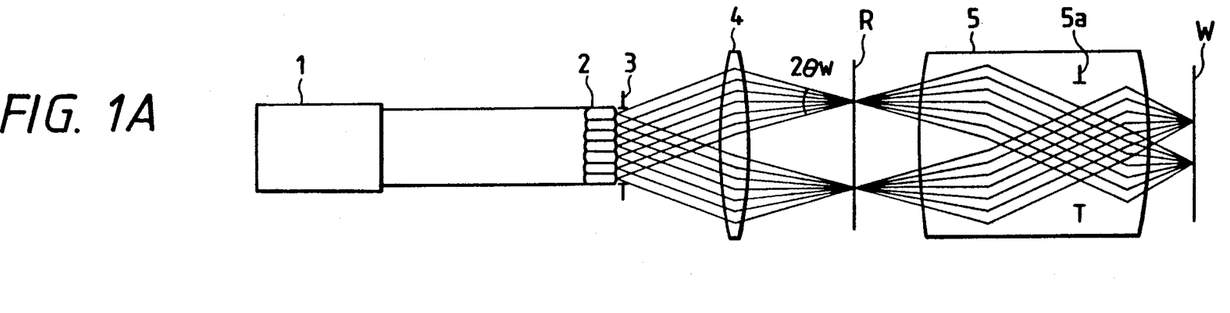
FIG. 1A is a view schematically showing the structure of a first embodiment of a projection exposure apparatus provided with an illuminating apparatus according to the present invention, which illustrates a state where a o value is defined as its first value.

Then, in an illuminating apparatus according to an embodiment of the present invention, the $\sin\theta_R$ is made variable by changing the size of the plane light source serving as a plurality of secondary light sources formed on the aperture stop 3 as well as the outer diameter of the optical integrator 2 as shown in FIG. 1A, for example. As clear from the equation (1), when the focal length fc is constant, the height y of the area to be irradiated, namely, the size of the area to be irradiated, is determined only by the aperture half angle $\theta_F$, but it is desirable to keep the size of the area to be irradiated constant even when the N.A. ($=\sin\theta_R$) of the illuminating optical system is varied. Therefore, when the multiple light beam formation means are replaced, that is, when the first optical integrator 2 is replaced with the second optical integrator, the replaced second optical integrator becomes comparatively enlarged or reduced as compared to the optical integrator 2 before the replacement, but the aperture half angle $\theta_F$ of each lens element which constitutes the first and second optical integrators before and after the replacement is equal.

Therefore, when the required $\sin\theta_R$ should be obtained by changing the size (aperture diameter D) of the plane light source by replacing the first and second optical integrators, it is possible to keep the number of the secondary light sources substantially constant if only the first optical integrator 2 is replaced with a second optical integrator 12 which has almost the same proportional size to the first optical integrator 2 as well as almost the same number of lens elements as the first optical integrator 2. At the same time, it is possible to maintain the illuminance even and the size of the area to be irradiated constant. In this case, however, it is desirable to change the diameter of the parallel light beams from the light source means in accordance with the size (aperture diameter D) of the plane light source without shielding light beams by the aperture stop 3 for the maintenance of the illuminance on the surface R to be irradiated.

Thus, in an illuminating apparatus according to an embodiment of the present invention, it becomes possible to change the $\sigma$ value in stages while maintaining the illuminance evenness desirably.

Also, for an illuminating apparatus according to an embodiment of the present invention, it is desirable to allow the parallel light beams, which are transmitted through the respective lens elements constituting the optical integrator, to illuminate the area to be illuminated on the reticle (area to be irradiated) in a size to cover it as shown in FIG. 4B.

In this case, given the focal length of each lens element constituting the optical integrator as $f_F$, the thickness (the length of diagonal lines if the sectional configuration of the lens element is rectangular or the diameter, if the sectional configuration of the lens element is circular) of each lens element as $L_F$, the focal length of the condensing optical system as $f_c$, and the size of the illuminating area of a reticle which is the surface to be irradiated as $2y$, the following relationship will be satisfied:

$$2y = f_c \cdot L_F / f_F \tag{3}$$

In this respect, when the first optical integrator and second optical integrator are replaceably arranged, it is desirable to substantially satisfy the following equation (4) with the relationship expressed in the above-mentioned equation (3) where the focal length of each lens element constituting the first optical integrator is $f_{1F}$, the thickness of each lens element constituting the first optical integrator, $L_{1F}$, the focal length of each lens element constituting the second optical integrator, $f_{2F}$, and the thickness of each lens element constituting the second optical integrator, $L_{2F}$:

$$L_{1F}/f_{1F} = L_{2F}/f_{2F} \tag{4}$$

Also, the number of the lens elements constituting the first optical integrator and the number of the lens elements constituting the second integrator are not necessarily equal, and given the outer diameter of the first optical integrator as $d_1$, the outer diameter of the second integrator as $d_2$, the number of the lens elements constituting the first optical integrator as $k_1$, and the number of the lens elements constituting the second optical integrator as $k_2$, it is preferable to satisfy the following condition:

$$0.75\, k_1 \leq k_2 \leq 1.25\, k_1,\ d_1 > d_2 \tag{5}$$

Within the range of this condition, it is practicably possible to secure a substantially even illumination. If the number of the lens elements of the second optical integrator is made smaller than the lower limit of this condition (5), it becomes difficult to secure illumination in an even state. If, on the contrary, the number of the lens elements of the second optical integrator is made greater than the condition (5), the number of each lens element constituting the second optical integrator becomes great. Thus, the thickness (diameter) must be made thin, making its fabrication difficult.

Hence, in a case where n numbers of the optical integrators are replaceably arranged, the above-mentioned equations (4) and (5) can generally be expressed as the following equations (6) and (7):

$$L_{1F}/f_{1F} = L_{mF}/f_{mF},\ 2 < m \leq n \tag{6}$$

$$0.75\, k_1 \leq k_m \leq 1.25\, k_1,\ d_1 > d_m \tag{7}$$

where $f_{1F}$: the focal length of each lens element constituting the first optical integrator.

$f_{mF}$: the focal length of each lens element constituting mth optical integrator.

$L_{1F}$: the thickness of each lens element constituting the first optical integrator.

$L_{mF}$: the thickness of each lens element constituting mth optical integrator.

$d_1$: the outer diameter of the first optical integrator.

$d_m$: the diameter of mth optical integrator.

$k_1$: the number of lens elements constituting the first optical integrator.

$k_m$: the number of lens elements constituting mth optical integrator.

Also, in an illuminating apparatus of the above-mentioned structure, the condensing optical system comprises a first lens system having a first focal length and a second lens system having a second focal length which differs from the focal length of the first focal length among other elements.

It may also be possible to arrange a structure so that the surface to be irradiated is illuminated with a first aperture number when the first optical integrator and the first lens system are provided in the light path of the illuminating apparatus, and that the surface to be irradiated is illuminated with a second aperture number which differs from the first aperture number when the second optical integrator and the second lens system are provided in the light path.

Figure 2A:
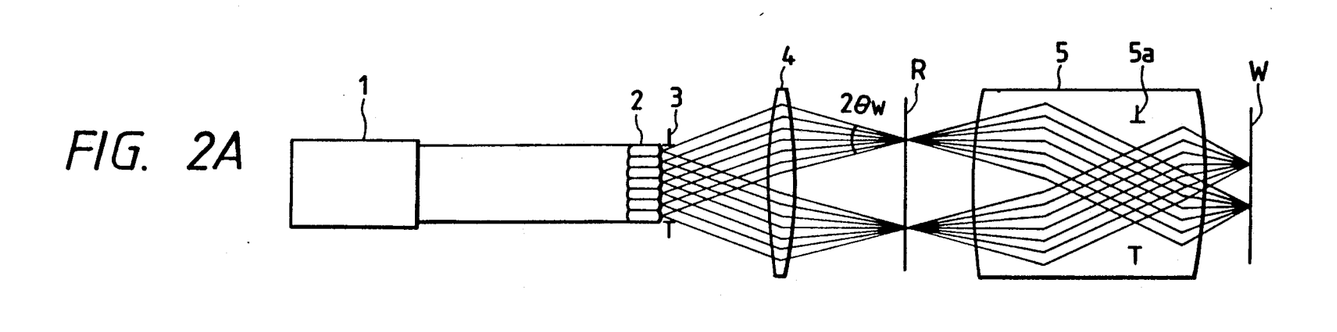
FIG. 2A is a view schematically showing the structure of a second embodiment of a projection exposure apparatus provided with an illuminating apparatus according to the present invention, which illustrates a state where a $\sigma$ value is defined as its first value.
Figure 2B:
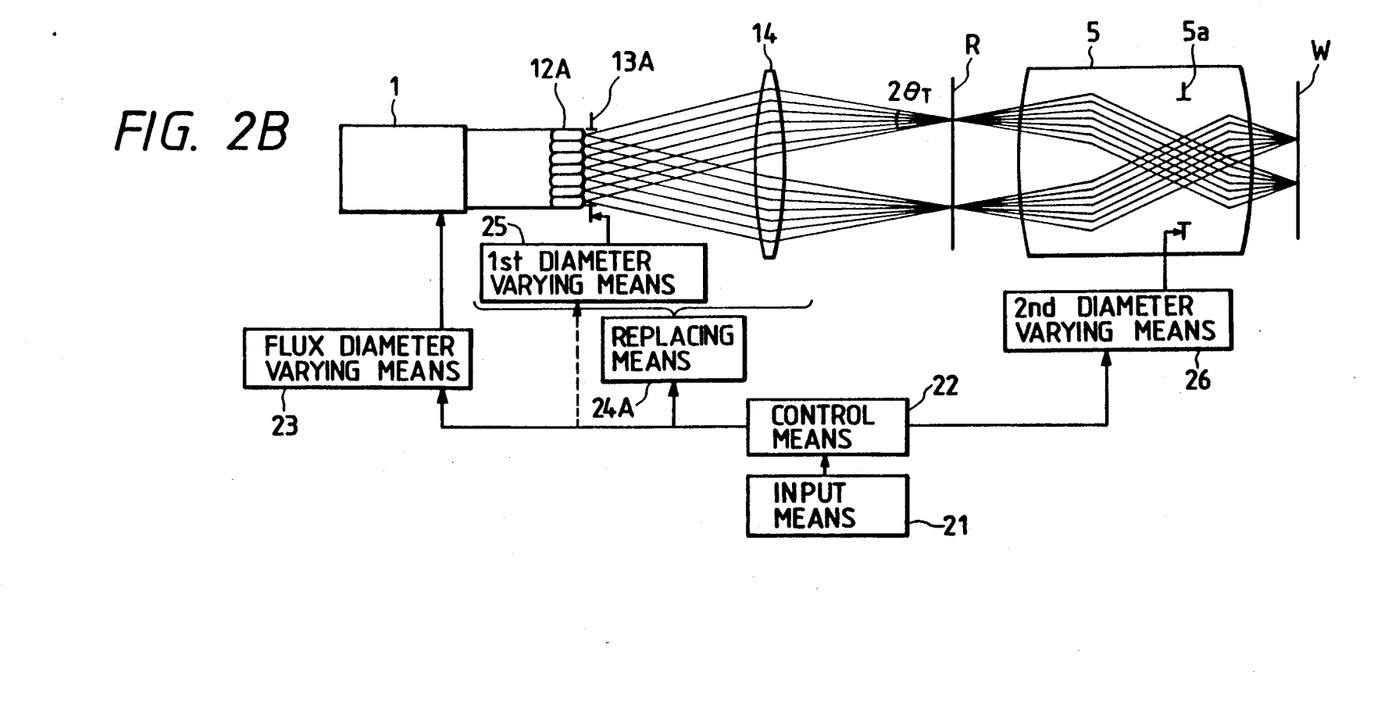
FIG. 2B is a view schematically showing the structure of a second embodiment of a projection exposure apparatus provided with an illuminating apparatus according to the present invention, which illustrates a state where a o value is defined as its second value.

This structure enables the N.A. ($=\sin\theta_R$) of the illuminating optical system to be varied by changing the focal length $f_c$ in the foregoing equation (2). To change the focal length $f_c$ means to replace the first lens system 4 serving as the condensing optical system with the second lens system 14 having a different focal length as shown in FIG. 2A and FIG. 2B, for example. In this case, too, it is desirable to make constant the height y of the surface to be irradiated in the equation (1), namely, the size of the area to be irradiated. To this end, as clear from the equation (1), the first optical integrator 2 should be replaced with the second optical integrator having an N.A. ($=\sin\theta_F$) which is inversely proportional to the focal length $f_c$. In other words, the first optical integrator 2 and the first lens system 4 are replaced as a whole with the second optical integrator 12A and the second lens system 14.

Further, in this respect, it is desirable to make the size of each of the lens elements constituting the first optical integrator 2 equal to the size of each of the lens elements constituting the second optical integrator 12A when the first and second optical integrators are constituted with a plurality of lens elements or the flyeye lenses. In this case, the size (aperture system D) of the surface light source is constant. Thus, the numbers of the lens elements are also the same. Consequently, the number of light beams which are superposed on the surface to be irradiated R is constant, making it possible to maintain the illuminance evenness. Here, it may be possible to make constant the diameter of light beam from the light source means 1. Also, the optical adjustment of the multiple light beam formation means (the first and second optical integrators) and the condensing optical system (the first and second lens systems) can be made as a whole, providing an advantage in maintaining accuracy in its fabrication.

Hence, there is no possibility that the illuminance evenness is degraded even when the multiple light beam formation means and condensing optical system are replaced as a whole. The $\sigma$ value can be varied step by step accordingly.

Also, in replacing the multiple light beam formation means and condensing optical system are replaced as a whole, it is desirable to allow the parallel beams which are transmitted through each of the lens elements constituting the optical integrator to illuminate the illuminating area on the reticle in a size large enough to cover it all substantially as shown in FIG. 4B. In this case, too, the relationship expressed in the above-mentioned equation (3) can be satisfied as in the illuminating apparatus according to an embodiment of the present invention.

Therefore, it is possible to make the second optical integrator and second lens system replaceable as a whole with the first optical integrator and first lens system. Here, it is desirable to satisfy the following equation (8) in consideration of the relationship expressed in the above-mentioned equation (3) where the focal length of each lens element constituting the first optical integrator is $f_{1F}$, the focal length of the first lens system, $f_{1C}$, the focal length of each lens element constituting the second optical integrator, $f_{2F}$, and the focal length of the second lens system, $f_{2C}$ provided that the thicknesses of each of the lens elements constituting the first and second optical integrators are equal to each other ($L_{1f_1} = L_{2F}$):

$$f_{1C}/f_{1F}=f_{2C}/f_{2F} \quad (8)$$

also, the number of the lens elements constituting the first optical integrator and the number of the lens elements constituting the second optical integrator and not necessarily the same. Now, given the focal length of each lens element constituting the first optical integrator as $f_{1F}$, the focal length of each lens element constituting the second optical integrator as $f_{2F}$, the number of lens elements constituting the first optical integrator as $k_1$, and the number of lens elements constituting the second optical integrator as $k_2$, it is preferable to satisfy the following condition:

$$0.75\ k_1 \leq k_2 \leq 1.25\ k_1, f_{1F} < f_{2F} \quad (9)$$

Within a range of this condition, it is practicably possible to secure a substantially even illumination. When the number of the lens elements of the second optical integrator becomes smaller than the lower limit of this condition (9), it becomes difficult to secure illumination evenly. When, on the contrary, the number of the lens elements of the second optical integrator becomes greater than the condition (9), not only it becomes difficult to fabricate the second optical integrator, but also the diameter of the second optical integrator becomes great. As a result, the effect anticipated by changing the $\sigma$ value with the provision of the second optical integrator and second lens system is significantly lowered. Here, in a case where n numbers of the optical integrators are replaceably arranged, the above-mentioned equations (8) and (9) can generally be expressed as the following equations (10) and (11):

$$f_{1C}/f_{1F}=f_{mC}/f_{mF}, 2<m\leq n \quad (10)$$

$$0.75\ k_1 \leq k_m \leq 1.25\ k_1, f_{1F} < f_{mF} \quad (11)$$

where $f_{1F}$: the focal length of each lens element constituting the first optical integrator.

$f_{mF}$: the focal length of each lens element constituting mth optical integrator.

$f_{1C}$: the focal length of the first lens system.

$f_{mC}$: the focal length of mth lens system.

$d_1$: the outer diameter of the first optical integrator.

$d_m$: the diameter of mth optical integrator.

$k_1$: the number of lens elements constituting the first optical integrator.

$k_m$: the number of lens elements constituting mth optical integrator.

Also, in order to achieve the above-mentioned object, a projection exposure apparatus according to another embodiment of the present invention is such that a first object illuminated by an illuminating apparatus is to be projected onto a second object through a projection optical system. Such an illuminating apparatus includes the following:

light source means to supply parallel light beams;

multiple light beam formation means to form a plurality of secondary light sources by the parallel light beams from the light source means; and a condensing optical system to condense light beams from the plural secondary light sources to superpose them to illuminate a first object.

The multiple light beam formation means includes a first optical integrator for the formation of a given number of secondary light sources as well as a second optical integrator provided replaceably with the first optical integrator to form substantially the same number of secondary light sources as the first optical integrator.

The illuminating apparatus is arranged so that when the first optical integrator is provided in the illuminating optical path, the first object is illuminated by a first aperture number, and that the second optical integrator is provided in the optical path, the first object is illuminated by a second aperture number which differs from the first aperture number.

Hence, in a projection exposure apparatus according to another embodiment of the present invention, even when a o value is changed by varying the size of the surface light source (a plurality of third light source images) to be formed on the pupil of a projection optical system, the plural numbers of the third light source images constituting this surface light source is made substantially constant. The illuminance evenness will be maintained desirably.

Also, in order to achieve the above-mentioned object, a projection exposure apparatus according to still another embodiment of the present invention is such that a first object illuminated by an illuminating apparatus is projected onto a second object through a projection optical system. Such an illuminating apparatus includes the following:

light source means to supply parallel light beams;

multiple light beam formation means to form a plurality of secondary light sources by the parallel light beams from the light source means; and a condensing optical system to condense the light beams from the plural secondary light sources to superpose them to illuminate the first object.

The multiple light beam formation means includes a first optical integrator and a second optical integrator which are replaceable with each other.

The first and second optical integrators form secondary light sources in a substantially same number, at the same time having the aperture number which differ from each other on the emission side.

The condensing optical system includes a first lens system having a first focal length, and a second lens system which is arranged replaceable with the first lens system and has a second focal length which differs from the first focal length.

The illuminating apparatus is structured to illuminate the first object by a first aperture number when the first optical integrator is provided in the illuminating light path, and that the first object is illuminated by a second aperture number which differs from the first aperture number when the second optical integrator is provided in the illuminating light path.

Hence, in a projection exposure apparatus according to still another embodiment of the present invention, even when the replacement is made from the first optical integrator and first lens system to the second optical integrator and second lens system (being provided in the illuminating light path of the illuminating apparatus), the plural numbers of the secondary light sources which are superposed on the second object side are not varied. The structure is arranged so that the aperture number on the second object of the illuminating apparatus is made variable. In other words, while maintaining the plural numbers of the third light source images which constitute the surface light source formed on the pupil of the projection optical system substantially the same, it is possible to change the $\sigma$ value. Thus, even if the $\sigma$ value of the illuminating apparatus is significantly changed, the illuminance evenness will not be degraded. Further, it is possible to make the size of the area to be irradiated on the first object substantially constant if the focal length of the condensing optical system and the aperture number on the emission side of the multiple light beam formation means are changed inversely proportional to each other substantially.

Also, in an illuminating apparatus as described above and a projection exposure apparatus provided with such an illuminating apparatus, it is desirable for the light source means to include a means to vary light beam diameter to change the diameter of the parallel light beams emitted from the aforesaid light source. Thus, it becomes possible to continuously change the size of the surface light source substantially corresponding to the aperture diameter D in the foregoing equation (2) so as to continuously change the $\sin\theta_R$ which is an N.A of the illuminating optical system within a range where an even illumination can be performed.

Further objects, features, and advantages of the present invention will become more clear by reference to the detailed description set forth below in conjunction with the accompanying drawings.

DETAILED DESCRIPTION OF THE PREFERRED EMBODIMENTS

Hereinafter, with reference to the accompanying drawings, the description will be made of embodiments according to the present invention.

Now, with reference to FIG. 1, the description will be made of a first embodiments of a projection exposure (hereinafter referred to as a stepper) apparatus provided with an illuminating apparatus according to the present invention.

Figure 1B:
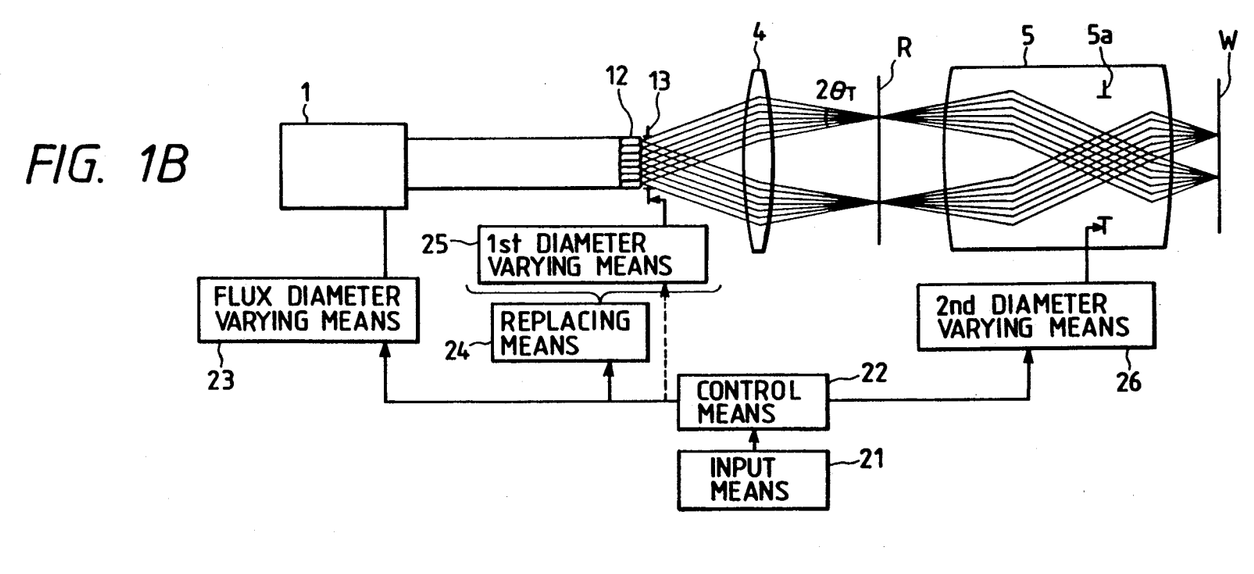
FIG. 1B is a view schematically showing the structure of a first embodiment of a projection exposure apparatus provided with an illuminating apparatus according to the present invention, which illustrates a state where a o value is defined as its second value.

FIG. 1A and FIG. 1B illustrate briefly an optical system according to the present embodiment. FIG. 1A represents a state where a $\sigma$ value is defined as its first value. FIG. 1B represents a state where a $\sigma$ value as its second value. In FIG. 1A, a reference numeral 1 designates a light source emitting parallel light beams the diameter of which is variable; 2, a first optical integrator comprising a flyeye lens (a collective body of plural bar lens elements), and the parallel light beams from the light source 1 enter the first optical integrator 2 to enable a number of secondary light sources (secondary light source images) on its emission plane. Also, on the secondary light source formation plane, a variable aperture stop 3 is arranged.

A reference numeral 4 designates the focal length $f_C$ of a condenser lens; R, a reticle with a given pattern. These secondary light sources and reticle R are respectively arranged on the focal planes of the condenser lens 4 on the object and image sides. The light beams emitted from the secondary light sources are converted by the condenser lens 4 into parallel light beams to illuminate the reticle R in a superposed manner. Then, the illuminating light transmitted through the reticle R are converged onto a wafer W through a projection lens 5. Thus, the given pattern on the reticle R is projected onto the wafer W. Also, the pupil plane of the projection lens 5 is conjugated with the secondary light source formation surface of the emission plane of the optical integrator 2. The so-called Köhler illumination is thus implemented. Here, a variable aperture stop 5a is also arranged on the pupil plane of the projection lens 5.

In FIG. 1B, a reference numeral 21 designates input means such as a key board or a bar code reader for the reticle R; 22, control means comprising a computer and the like to control the entire operation. In accordance with reticle patterns and others to be used, an optimal aperture number for the projection lens and a $\sigma$ value of the illuminating optical system are inputted by the input means 21 into the control means 22. The control means 22 changes the aperture number for the projection lens 5 through a second aperture variable means 26 in accordance with inputted information; thus replacing the optical integrator and the aperture stop as a whole through a replacing means 24. In FIG. 1B, a second optical integrator 12 and a second variable aperture stop 13 are installed between the light source system 1 and condenser lens 4.

The second optical integrator 12 also comprises a flyeye lens, and the number of its elements is the same as that of the first optical integrator 2. Then, given the ratio of the outer diameter of the second optical integrator as $\alpha$, the outer diameter and focal length of the second optical integrator are defined as $1/\alpha$ with respect to the first optical integrator 2. Therefore, the Ns.A. on the emission sides of the first optical integrator 2 and second optical integrator 12 are the same. In this respect, it may be possible to use the same variable aperture stops 3 and 13 without any replacement.

Further, the control means 22 defines an N.A. of the illuminating optical system in accordance with the $\sigma$ value by changing the aperture diameter of the variable aperture stop 13 through the first diameter varying means 25. Also, a reference numeral 23 designates the flux diameter varying means the operation of which is interlocked with the first diameter varying means 25. The diameter of light beam supplied from the light source system 1 to the optical integrator 2 or 12 is varied by the flux diameter varying means 23 so as to be substantially equal to the aperture diameter of the variable aperture stop 3 or 13. In this way, the light beam from the light source system can be utilized efficiently.

Figure 5A:
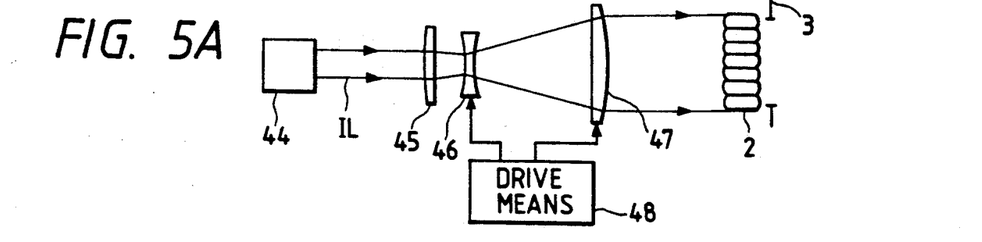
FIG. 5A is a view schematically showing the structure of an example of the variable power optical system which serves as means to vary the light beam diameter, which represents a state where the diameter of parallel light beams is great.
Figure 5B:
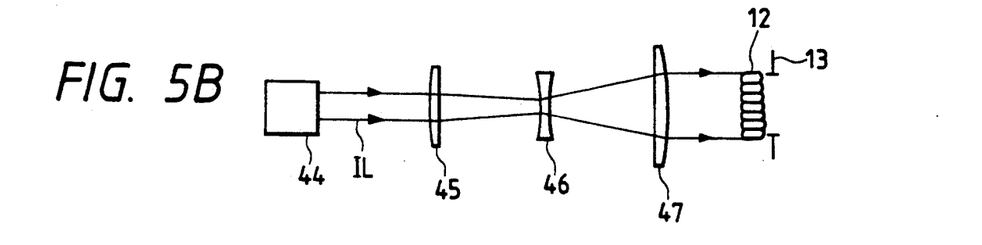
FIG. 5B is a view schematically showing the structure of an example of the variable power optical system which serves as means to vary the light beam diameter, which represents a state where the diameter of parallel light beams is small.

As the replacing means 24, a rotary mechanism of a turret type or the like is used, for example. Also, as the flux diameter varying means 23, a driving means 48 of the variable power optical system as shown in FIG. 5A and FIG. 5B can be employed, for example. In other words, in FIG. 5A, the parallel light beams IL emitted from the light source 44 are allowed to illuminate the first optical integrator 2 with an enlarged flux diameter through the positive first lens group 45, negative lens group 46, and positive second lens group 47. Also, the negative lens group 46 and positive second lens group 47 are shiftably supported by a driving means 48 along the optical axis. The positions of the negative lens group 46 and positive second lens group 47 are adjusted by the driving means 48 so that the aperture diameter of the first variable aperture stop 3 and the diameter of the incident light beam are made almost equal. Further, as shown in FIG. 5B, for example, when the second optical integrator 12 and the second variable aperture stop 13 are installed, it is possible to match the diameter of the incident light beam substantially with the aperture diameter of the second variable aperture stop 13 by changing the positions of the negative lens group 46 and positive second lens group 47 comparatively great. A variable power optical system such as this is disclosed in Japanese Patent Laid-Open Application No. 1-96929, for example.

Now, reverting to FIG. 1, the operation of the first embodiment will be described. Here, it is assumed that the aperture diameters of the variable aperture stops 3 and 13 are defined to match the outer diameters of the optical integrators 2 and 12, respectively. At first, in a case shown in FIG. 1A, if the outer diameter of the first optical integrator 2 is given as d, and the aperture angle of the light beam which illuminates the reticle R, as $2\theta w$ with the condenser lens 4 which is assumed to satisfy the required sinusoid condition, an $NA_{IL}1$ which is the N.A. of the illuminating optical system for the reticle R will be expressed as follows:

$$NA_{IL}1 = \sin\theta w = d/(2f_c) \tag{12}$$

Also, in a case shown in FIG. 1B, if the ratio of the outer diameter of the first optical integrator to the outer diameter of the second optical integrator is given as $\alpha$, the diameter of the second optical integrator 12 will be $d/a$. Therefore, given the aperture angle of the light beam which illuminates the reticle R as $2\theta_r$, the $NA_{IL}2$ which is the N.A. of the illuminating optical system will be as follows:

$$NA_{IL}2 = \sin\theta_r = d/(2af_c) \quad (13)$$

Accordingly, the N.A. of the illuminating system is changed to be $1/a$. On the other hand, the numbers of the lens elements constituting the first optical integrator 2 and the second optical integrator 12 are the same. The numbers of light beams from the second light sources which are superimposed on the reticle R are also the same. Hence, the illuminance evenness can be maintained. Further, given the aperture number on the common emission side of the first optical integrator 2 and the second optical integrator 12 as $\sin\theta_F$, a half size of the illuminating area on the reticle R in FIG. 1A and a half size of the illuminating area on the reticle R in FIG. 1B are both $f_c \sin\theta_F$ and are equal.

Therefore, according to the present embodiment, there is an advantage that the N.A. of the illuminating optical system, namely, the $\sigma$ value, can be changed significantly in accordance with the kinds of reticle R or the characteristics of the projection lens 5 while maintaining the illuminance evenness and the illuminating area on the reticle R constant by replacing the optical integrators. In other words, according to the present embodiment, even when the $\sigma$ value is changed correspondingly for a reticle R to be used, a highly even illuminance can be maintained, thus providing an advantage to keep the accuracy of the patterning dimensions on the imaging plane.

Also, by changing the aperture diameter of the variable aperture stop 3 or 13, it is possible to adjust the N.A. of the illuminating optical system minutely.

Furthermore, when an arbitrary flyeye lens is installed in the light path of the illuminating system, it may be possible to continuously change the $\sigma$ value by varying the diameter of the parallel light beams from the light source system 1 until it is set within a range where the illumination is performed evenly. Thus, when an arbitrary flyeye lens is installed, the $\sigma$ value can be changed step by step, and when the diameter of the parallel light beams from the light source system 1 is being varied, the $\sigma$ value can be changed continuously. As a whole, therefore, it is practicably possible to change the $\sigma$ value in a wide range.

Also, as in the first embodiment, it is not necessarily required to make the numbers of the lens elements constituting the first optical integrator 2 and the second optical integrator 12 equal. Only if the foregoing equation (5) can be satisfied, the reticle R can be illuminated evenly.

Now, with reference to FIG. 2A and FIG. 2B, the description will be made of a second embodiment according to the present invention. Compared to the first embodiment shown in FIG. 1A and FIG. 1B, the present embodiment is such that the condenser lens serving as a condensing optical system is further arranged to be variable. In FIGS. 2A and 2B, the same reference marks are given to the elements corresponding to those appearing in FIGS. 1A and 1B and the detailed description thereof will be omitted.

FIG. 2A and FIG. 2B briefly illustrate an optical system according to the present embodiment briefly. FIG. 2A represents a state where a $\sigma$ value is defined as a first value. FIG. 2B represents a state where a $\sigma$ value is defined as a second value. Although FIG. 2A shows a structure which is fundamentally identical to the structure shown in FIG. 1A, the condenser lens 4 having a focal length $f_c$ is also replaceable. Thus, the one at 4 is designated as a first condenser lens.

In FIG. 2B, a reference numeral 24A designates replacing means. With instructions from control means 22, this replacing means 24A replaces as a whole an optical integrator, variable aperture stop, and condenser lens with another optical integrator, another variable aperture stop, and another condenser lens. In FIG. 2B, there are arranged in the order from the light source system 1 to the reticle R, a second optical integrator 12A comprising a flyeye lens, a second variable aperture stop 13A, and a second condenser lens 14.

In this case, given the ratio of the focal length of the second condenser lens 14 to the focal length of the first condenser lens 4 as $\beta$, the focal length of the second condenser lens 14 will be $\beta f_c$, and given the N.A. of the first optical integrator 2 on the emission side as $\sin\theta_F$, the N.A. of the second optical integrator 12A on the emission side will be defined as $\sin\theta_F/\beta$. Further, the numbers of the lens elements constituting the first optical integrator 2 and second optical integrator 12A are the same. The outer diameters are also the same. Moreover, the second variable aperture stop 13A is arranged on the second light source formation plane formed by the second optical integrator 12A. This secondary light source formation plane and reticle R are respectively positioned in the focal plane on the object side and focal plane on the imaging side of the second condenser lens 14. Any other structures are the same as the first embodiments.

Now, the operation of the second embodiment will be described. It is assumed that the aperture diameters of the variable aperture stops 3 and 13A are set to match the outer diameters of the optical integrators 2 and 12A, respectively. At first, in a case in FIG. 2A, if the outer diameter of the first optical integrator 2 is given as d and the aperture angle of the light beam to illuminate the reticle R, as $2\theta w$ with the first condenser lens 4 which satisfies the sinusoid condition, the $NA_{IL}3$ which is the N.A. of the illuminating optical system for the reticle R will be as follows:

$$NA_{IL}3 = \sin\theta w = d/(2f_c) \quad (14)$$

Also, in a case in FIG. 2B, since the outer diameter of the second optical integrator 12 is given as d while the focal length of the second condenser lens 14, as $\beta f_c$, the $NA_{IL}4$ which the N.A. of the illuminating optical system will be as follows provided that the aperture angle of the light beams to illuminate the reticle R is $2\theta_T$:

$$NA_{IL}4 = \sin\theta_r = d/(2\beta f_c) \quad (15)$$

Therefore, the N.A. of the illuminating optical system is now changed to be $1/\beta$. Compared to this, since the numbers of the lens elements constituting the first optical integrator 2 and second optical integrator 12A are the same, the numbers of the secondary light beams to be superimposed on the reticle R are also the same. Thus, the illuminance evenness can be maintained.

Further, a half size of the illuminating area on the reticle R in the case in FIG. 2A is $f_c \sin\theta_F$. Also, in the case in FIG. 2B, since the N.A. of the second optical integrator 12A on the emission side is $\sin\theta_F/\beta$ and the focal length of the second condenser lens 14 is $\beta f_c$, a half size of the illuminating area on the reticle R in FIG. 2B is also $f_c \sin\theta_F$.

Therefore, according to the present embodiment, there is an advantage that the N.A. of the illuminating optical system can be significantly changed in accordance with the kinds of reticle R or the characteristics of the projection lens 5 while maintaining the illuminance evenness and illuminating area on the reticle R constant by replacing the optical integrators and condenser lenses. Also, by changing the aperture diameter of the variable aperture stop 3 or 13A, the N.A. of the illuminating optical system can be adjusted minutely.

Moreover, as in the first embodiment, when an arbitrary flyeye lens is installed in the light path of the illuminating system, it may be possible to continuously change the $\sigma$ value by varying the diameter of the parallel light beams from the light source system 1 until it arrives at the range where the illumination can be performed evenly. Thus, when an arbitrary flyeye lens is installed, the $\sigma$ value can be changed step by step and when the diameter of the parallel light beams from the light source system 1 is varied, the $\sigma$ value can be changed continuously. As a whole, therefore, the $\sigma$ value can be changed practically in a wide range.

Also, as in the second embodiment, it is not necessarily required to make the number of the lens elements constituting the first optical integrator 2 and the number of the lens elements constituting the second optical integrator 12 equal. Only if the foregoing equation (9) can be satisfied, the reticle R can be illuminated evenly.

In this respect, given the outer diameter of the optical integrator as d and the focal length of the condenser lens as $f_c$ in general, the N.A. of the illuminating optical system ($=\sin\theta_F$) can be expressed as $d/(2f_c)$. Then, in the above-mentioned first embodiment, by changing the outer diameter d and in the second embodiment, by changing the focal length $f_c$, the N.A. of the illuminating optical system is changed, respectively. Besides this, it will be clear that the N.A. of the illuminating optical system can be changed greater by varying the outer diameter d of the optical integrator and the focal length $f_c$ of the condenser lens simultaneously.

In this case, too, it is possible to maintain the illuminance evenness by making substantially constant the numbers of the light beams from the secondary light sources which are superposed on the reticle R by keeping the numbers of the lens elements constituting the optical integrators constant. Moreover, it is possible to maintain the size of the area to be illuminated on the reticle R constant by arranging to make constant a product of the focal length $f_c$ of the condenser lens and the $\sin\theta_F$ which is the N.A. of the optical integrator.

Also, in the above-mentioned embodiment, while a case where a flyeye lens is employed as the optical integrator is shown, it may be possible to use a rod type optical integrator (rod lens and the like) for the optical integrator, for example.

Further, while the flyeye lens used as the optical integrator in each of the above-mentioned embodiments comprises a collective body of lens elements having lens planes on the incident side and emission side, it may be possible to constitute a flyeye lens with a lens element collective body having its lens plane only on the incident side if an excimer laser or other laser light source is employed.

Also, when the optical integrator comprises a flyeye lens, the sectional configuration of each lens element can be of a polygon including a square, a circular, or others as a matter of course.

Also, in each of the above-mentioned embodiments, the description has been made of a case where the flyeye lens serving as multiple light beam formation means are only two sets, but it is clear that more than two sets of the flyeye lenses can be installed for the purpose. Here, in this case, it is desirable that the numbers of the secondary light sources formed by the plural flyeye lenses are substantially the same, respectively.

As described above, the present invention is not confined to the above-mentioned embodiments only, but it can be modified in various ways within a range where such modifications do not depart from the purport of the present invention.

What is claimed is:

1. An illuminating apparatus including the following:
   light source means to supply parallel light beams;
   multiple light beam formation means to form a plurality of secondary light sources by the parallel light beams from said light source means; and
   a condensing optical system to condense the light beams from said plural secondary light sources to illuminate an area to be irradiated in a superposed manner,
   said multiple light beam formation means including a first optical integrator which forms a given number of secondary light sources, and a second optical integrator which is arranged replaceably with said first optical integrator and forms substantially the same number of second light sources as the first optical integrator,
   said area to be irradiated being illuminated with a first aperture number when said first optical integrator is installed in the illuminating light path, and
   said area to be irradiated being illuminated with a second aperture number which differs from said first aperture number when said second optical integrator is installed in said light path.

2. An illuminating apparatus according to claim 1, wherein
   said first and second optical integrators include a plurality of lens elements, respectively, and
   said first and second optical integrators and said condensing optical system satisfy the following conditions:

$$2y = f_c \cdot L_f / f_F$$

where
   $2y$ : the size of said area to be irradiated,
   $f_c$ : the focal length of said condensing optical system,
   $L_F$ : the thickness of said lens elements,
   $f_F$ : the focal length of said lens elements.

3. An illuminating apparatus according to claim 1, wherein
   said first optical integrator and said second optical integrator are both structured to have the same aperture numbers on the emission sides.

4. An illuminating apparatus according to claim 1, wherein
   said first and second optical integrators include a plurality of lens elements, respectively, and satisfy the following conditions:

$$L_{1F}/f_{1F} = L_{2F}/f_{2F}$$

where
- $L_{1F}$: the thickness of said lens elements constituting said first optical integrator.
- $f_{1F}$: the focal length of said lens elements constituting said first optical integrator,
- $L_{2F}$: the thickness of said lens elements constituting said second optical integrator,
- $f_{2F}$: the focal length of said lens elements constituting said second optical integrator.

5. An illuminating apparatus according to claim 4, wherein
said first and second optical integrators satisfy the following conditions:

$$0.75\, k_1 \leq k_2 \leq 1.25\, k_1,\ d_1 > d_2$$

where
- $d_1$: the outer diameter of said first optical integrator,
- $d_2$: the outer diameter of said second optical integrator,
- $k_1$: the number of said lens elements constituting said first optical integrator,
- $k_2$: the number of said lens elements constituting said second optical integrator.

6. An illuminating apparatus according to claim 4, wherein said apparatus includes:
replacing means to install either one of said first and second optical integrators in the illuminating light path;
input means to input information regarding illuminating conditions; and
control means to control said replacing means in accordance with said information from said input means.

7. An illuminating apparatus according to claim 6, wherein
said apparatus further includes:
aperture stops arranged on the said secondary light source sides of said first and second optical integrators, which are structured to make the aperture diameters variable; and
aperture diameter varying means to change said aperture diameters, and
control means controls said aperture diameter varying means.

8. An illuminating apparatus according to claim 7, wherein
said light source means includes flux diameter varying means to change the diameter of said parallel light beams; and
said control means controls said flux diameter varying means.

9. An illuminating apparatus according to claim 8, wherein
said flux diameter varying means includes a variable power optical system to change the diameter of said parallel light beams.

10. An illuminating apparatus according to claim 1, wherein
said condensing optical system has at least a first lens system and said second lens system which are replaceable with each other,
said first lens system and said second lens system have the focal lengths which differ from each other,
said first optical integrator and said second optical integrator have the aperture numbers on the emissions sides, which differ from each other,
said area to be irradiated is illuminated with a first aperture number when said first optical integrator and said first lens system are illustrated in the light path of the said illuminating apparatus, and
said area to be irradiated is illuminated with a second aperture number which differs from said first aperture number when said second optical integrator and said second lens system are installed in said light path.

11. An illuminating apparatus according to claim 10, wherein
said first and second optical integrators include a plurality of lens elements, respectively, and
said first and second optical integrators and said first and second lens systems satisfy the following conditions:

$$f_{1C}/f_{1F} = f_{2C}/f_{2F}$$

where
- $F_{1C}$: the focal length of said first lens system,
- $f_{1F}$: the focal length of said lens elements constituting said first optical intergrator,
- $F_{2C}$: the focal length of said first lens system,
- $f_{2F}$: the focal length of said lens elements constituting said second optical integrator.

12. An illuminating apparatus according to claim 11 wherein
said first and second optical integrators satisfy the following conditions:

$$0.75\, k_1 \leq k_2 \leq 1.25\, k_1,\ f_{1F} > f_{2F}$$

where
- $f_{1F}$: the focal length of said lens elements constituting said first optical integrator,
- $f_{2F}$: the focal length of said lens elements constituting said second optical integrator,
- $k_1$: the number of said lens elements constituting said first optical integrator,
- $k_2$: the number of said lens elements constituting said second optical integrator.

13. An illuminating apparatus according to claim 10 wherein
said apparatus includes:
replacing means to install either one of said first and second optical integrators in the illuminating light path;
input means to input information regarding illuminating conditions; and
control means to control said replacing means in accordance with said information from said input means 14. An illuminating apparatus according to claim 13 wherein
said apparatus further includes:
aperture stops arranged on the said secondary light source sides of said first and second optical integrators, which are provided to make the aperture diameters variable; and
aperture diameter varying means to change said aperture diameters, and
said control means controls said aperture diameter varying means.

15. An illuminating apparatus according to claim 14 wherein said light source means includes flux diameter varying means to change the diameter of said parallel light beams; and said control means controls said flux diameter varying means.

16. An illuminating apparatus according to claim 15 wherein said flux varying means includes a variable power optical system to change the diameter of said parallel light beams.

17. A projection exposure apparatus projecting a first object illuminated by an illuminating apparatus onto a second object through a projection optical system, said illuminating apparatus including the following:

light source means to supply parallel light beams;

multiple light beam formation means to form a plurality of secondary light sources by the parallel light beams from said light source means; and a condensing optical system to condense the light beams from said plural secondary light sources to illuminate an area to be irradiated in a superposed manner, said multiple light beam formation means including a first optical integrator which forms a given number of secondary light sources, and a second optical integrator which is arranged replaceably with said first optical integrator and forms substantially the same number of second light sources as the first optical integrator, said area to be irradiated being illuminated with a first aperture number when said first optical integrator is installed in the illuminating light path, and said area to be irradiated being illuminated with a second aperture number which differs from said first aperture number when said second optical integrator is installed in said light path.

18. A projection exposure apparatus according to claim 17 wherein said first and second optical integrators include a plurality of lens elements, respectively, and satisfy the following conditions:

$$L_{1F}/f_{1F}=L_{2F}/f_{2F}$$

where $L_{1F}$: the thickness of said lens elements constituting said first optical integrator, $f_{1F}$: the focal length of said lens elements constituting said first optical intergrator, $L_{2F}$: the thickness of said lens elements constituting said second optical integrator, $f_{2F}$: the focal length of said lens elements constituting said second optical integrator.

19. A projection exposure apparatus according to claim 17, wherein said apparatus includes:

replacing means to install either one of said first and second optical integrators in the illuminating light path;

input means to input information regarding illuminating conditions; and control means to control said replacing means in accordance with said information from said input means.

20. A projection exposure apparatus according to claim 19, wherein said apparatus further includes:

first aperture stops arranged on the said secondary light source sides of said first and second optical integrators, which are structured to make the aperture diameters variable;

a first aperture diameter varying means to change the aperture diameters of said first aperture stops, second aperture stops arranged in the said projection optical system, which are structured to make the aperture diameters variable; and a second aperture varying means to change the aperture diameters of said second aperture stops, and said control means controls said first and second aperture diameter varying means.

21. A projection exposure apparatus projecting a first object illuminated by an illuminating apparatus onto a second object through a projection optical system, said illuminating apparatus including the following:

light source means to supply parallel light beams;

multiple light beam formation means to form a plurality of secondary light sources by the parallel light beams from said light source means; and a condensing optical system to condense the light beams from said plural secondary light sources to illuminate an area to be irradiated in a superposed manner, said multiple light beam formation means including a first optical integrator and a second optical integrator which are replaceable with each other, said first and second optical integrators forming substantially the same numbers of secondary light sources and having the aperture numbers which differ from each other on the emission sides, said condensing optical system including a first lens system having a first focal length, and a second lens system having a second focal length which differs from said first focal length, said first object being illuminated with a first aperture number when said first optical integrator is installed in the illuminating light path of said first optical integrator, said first object being illuminated with a second aperture number which differs from said first aperture number when said second optical integrator is installed in said light path, and said area to be irradiated being illuminated with a second aperture number which differs from said first aperture number when said second optical integrator.

22. A projection exposure apparatus according to claim 21, wherein said first and second optical integrators include a plurality of lens elements, respectively, and said first and second optical integrators, and said condensing optical system satisfy the following conditions:

$$f_{1C}/f_{1F}=f_{2C}/f_{2F}$$

where $F_{1C}$: the focal length of said first lens system, $f_{1F}$: the focal length of said lens elements constituting said first optical intergrator, $F_{2C}$: the focal length of said first lens system, $f_{2F}$: the focal length of said lens elements constituting said second optical integrator.

23. A projection exposure apparatus according to claim 21, wherein said projection exposure apparatus includes:

replacing means to install either one set of said first lens system and said first optical integrator, and said second lens system and said second optical integrator in the illuminating light path;

input means to input information regarding illuminating conditions; and control means to control said replacing means in accordance with said information from said input means.

24. A projection exposure apparatus according to claim 23, wherein said projection exposure apparatus further includes:

first aperture stops arranged on said secondary light source sides of said first and second optical integrators, which are provided to make the aperture diameters variable;

a first aperture varying means to change the aperture diameters of said first aperture stops; and second aperture stops arranged in said projection optical system, which are provided to make the aperture diameters variable, and a second aperture varying means to change the aperture diameters of said second aperture stops, and said control means controls said first and second varying means.

* * * * *